(12) United States Patent
Bothe et al.

(10) Patent No.: US 10,923,585 B2
(45) Date of Patent: Feb. 16, 2021

(54) HIGH ELECTRON MOBILITY TRANSISTORS HAVING IMPROVED CONTACT SPACING AND/OR IMPROVED CONTACT VIAS

(71) Applicant: Cree, Inc., Durham, NC (US)

(72) Inventors: Kyle Bothe, Cary, NC (US); Evan Jones, Durham, NC (US); Dan Namishia, Wake Forest, NC (US); Chris Hardiman, Morrisville, NC (US); Fabian Radulescu, Chapel Hill, NC (US); Jeremy Fisher, Raleigh, NC (US); Scott Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/440,427

(22) Filed: Jun. 13, 2019

(65) Prior Publication Data

US 2020/0395474 A1     Dec. 17, 2020

(51) Int. Cl.
| | | |
|---|---|---|
| *H01L 31/101* | (2006.01) | |
| *H01L 21/338* | (2006.01) | |
| *H01L 29/778* | (2006.01) | |
| *H01L 23/48* | (2006.01) | |
| *H01L 29/66* | (2006.01) | |
| *H01L 21/768* | (2006.01) | |

(52) U.S. Cl.
CPC .... *H01L 29/7786* (2013.01); *H01L 21/76897* (2013.01); *H01L 23/481* (2013.01); *H01L 29/66462* (2013.01)

(58) Field of Classification Search
CPC ...................... H01L 29/66462; H01L 29/7786
USPC .................................. 438/175–180; 257/187
See application file for complete search history.

(56) References Cited

U.S. PATENT DOCUMENTS

| | | |
|---|---|---|
| 4,946,547 A | 8/1990 | Palmour et al. |
| 5,192,987 A | 3/1993 | Khan et al. |
| 5,200,022 A | 4/1993 | Kong et al. |
| 5,210,051 A | 5/1993 | Carter, Jr. |
| 5,296,395 A | 3/1994 | Khan et al. |
| RE34,861 E | 2/1995 | Davis et al. |
| 5,393,993 A | 2/1995 | Edmond et al. |
| 5,523,589 A | 6/1996 | Edmond et al. |
| 6,316,793 B1 | 11/2001 | Sheppard et al. |
| 6,548,333 B2 | 4/2003 | Smith |
| 7,045,404 B2 | 5/2006 | Sheppard et al. |
| 7,259,402 B2 | 8/2007 | Edmond et al. |

(Continued)

FOREIGN PATENT DOCUMENTS

EP     2339635     6/2011

OTHER PUBLICATIONS

Chakraborty et al., "High-Power AlGaN/GaN HEMTs for Ka-Band Applications", IEEE Electron Device Letters, vol. 26, No. 11, Nov. 2005, pp. 781-783.

(Continued)

*Primary Examiner* — Calvin Lee
(74) *Attorney, Agent, or Firm* — Myers Bigel, P.A.

(57) ABSTRACT

A high electron mobility transistor (HEMT) includes a substrate comprising a first surface and a second surface on opposing sides of the substrate, a channel layer on the first surface of the substrate opposite the substrate, a barrier layer on the channel layer, a source contact comprising a first ohmic contact on an upper surface of the barrier layer, and a via extending from the second surface of the substrate to the first ohmic contact.

19 Claims, 13 Drawing Sheets

(56) References Cited

U.S. PATENT DOCUMENTS

| | | | |
|---|---|---|---|
| 7,291,529 B2 | 11/2007 | Slater, Jr. et al. | |
| 7,544,963 B2 | 6/2009 | Saxler | |
| 7,548,112 B2 | 6/2009 | Sheppard | |
| 7,615,774 B2 | 11/2009 | Saxler | |
| 7,932,111 B2 | 4/2011 | Edmond | |
| 8,049,252 B2 | 11/2011 | Smith et al. | |
| 8,513,686 B2 | 8/2013 | Edmond | |
| 8,563,372 B2 | 10/2013 | Hagleitner et al. | |
| 9,136,396 B2* | 9/2015 | Ko | H01L 29/808 |
| 9,214,352 B2 | 12/2015 | Hagleitner et al. | |
| 9,226,383 B2* | 12/2015 | Mishra | H05K 1/181 |
| 9,362,198 B2* | 6/2016 | Viswanathan | H01L 29/2003 |
| 9,570,438 B1 | 2/2017 | Curatola et al. | |
| 10,312,358 B2* | 6/2019 | Ren | H01L 29/2003 |
| 2007/0164315 A1 | 7/2007 | Smith et al. | |
| 2008/0035934 A1 | 2/2008 | Sheppard et al. | |
| 2015/0364591 A1 | 12/2015 | Lu | |
| 2018/0240902 A1 | 8/2018 | Odnoblyudov et al. | |

OTHER PUBLICATIONS

J.S. Moon et al., "Gate-Recessed AlGaN-GaN HEMTs for High-Performance Millimeter-Wave Applications", IEEE Electron Device Letters, vol. 26, No. 6, Jun. 2005, pp. 348-350.

Ando, et al., "30-GHz-Band Over 5-W Power Performance of Short-Channel AlGaN/GaN Heterojunction FETs", IEEE Transactions on Microwave Theory and Techniques, vol. 53, No. 1, Jan. 2005, pp. 74-80.

PCT Invitation to Pay Additional Fees and, Where Applicable, Protest Fee, including Annex to Form PCT/ISA/206, Communication Relating to the Results of the Partial International Search, dated Sep. 1, 2020 for corresponding PCT International Application No. PCT/US2020/037391 (10 pages).

Antcliffe M et al: "Gate-Recessed AlGaN—GaN HEMTs for High-Performance Millimeter-Wave Applications", IEEE Electron Device Letters, IEEE, vol. 26, No. 6, Jun. 1, 2005 (Jun. 1, 2005), pp. 348-350,XP011132383, ISSN: 0741-3106, DOI: 10.1109/LED.2005. 848107.

Dammann M. etal: "Reliability status of GaN transitors and MMICs in Europe", Reliability Physics Symposium (IRPS), 2010 IEEE International, IEEE, Piscataway, NJ, USA, May 2, 2010 (May 2, 2010), pp. 129-133, XP031692348, ISBN: 978-1-4244-5430-3.

PCT Written Opinion of the International Searching Authority, dated Oct. 29, 2020 for corresponding PCT International Application No. PCT/US2020/037391 (14 pages).

PCT International Search Report, dated Oct. 29, 2020 for corresponding PCT International Application No. PCT/US2020/037391 (7 pages).

\* cited by examiner

HIGH ELECTRON MOBILITY TRANSISTORS HAVING IMPROVED CONTACT SPACING AND/OR IMPROVED CONTACT VIAS

FIELD

The inventive concepts described herein relate to semiconductor devices and, more particularly, to high electron mobility transistors.

BACKGROUND

Electronic devices formed in lower bandgap semiconductor materials such as silicon and gallium arsenide have found wide application in lower power and (in the case of silicon) lower frequency applications. These semiconductor materials may be less well suited for higher power and/or high frequency applications, however, because of their relatively small bandgaps (e.g., 1.12 eV for silicon and 1.42 eV for gallium arsenide at room temperature) and/or relatively small breakdown voltages.

For high power, high temperature, and/or high frequency applications, devices formed in wide bandgap semiconductor materials such as silicon carbide (2.996 eV bandgap for alpha silicon carbide at room temperature) and the Group III nitrides (e.g., 3.36 eV bandgap for gallium nitride at room temperature) are often used. These materials, typically, have higher electric field breakdown strengths and higher electron saturation velocities as compared to gallium arsenide and silicon.

A device of particular interest for high power and/or high frequency applications is the High Electron Mobility Transistor (HEMT). HEMT devices may offer operational advantages in a number of applications. In operation, a two-dimensional electron gas (2DEG) is formed in a HEMT device at the heterojunction of two semiconductor materials with different bandgap energies, where the smaller bandgap material has a higher electron affinity. The 2DEG is an accumulation layer in the smaller bandgap material and can contain a very high sheet electron concentration. Additionally, electrons that originate in the wider-bandgap semiconductor material transfer to the 2DEG layer, allowing a high electron mobility due to reduced ionized impurity scattering. This combination of high carrier concentration and high carrier mobility can give the HEMT a very large transconductance and may provide a strong performance advantage over metal oxide semiconductor field effect transistors (MOSFETs) for high-frequency applications.

High electron mobility transistors fabricated in Group III-nitride based material systems have the potential to generate large amounts of radio frequency (RF) power because of the combination of material characteristics that includes the aforementioned high breakdown fields, wide bandgaps, large conduction band offset, and/or high saturated electron drift velocity.

SUMMARY

Pursuant to some embodiments of the present invention, a high electron mobility transistor (HEMT) includes a substrate comprising a first surface and a second surface on opposing sides of the substrate, a channel layer on the first surface of the substrate opposite the substrate, a barrier layer on the channel layer, a source contact comprising a first ohmic contact on an upper surface of the barrier layer, and a via extending from the second surface of the substrate to the first ohmic contact.

In some embodiments, the HEMT further includes a backmetal layer within the via.

In some embodiments, the backmetal layer directly contacts the first ohmic contact.

In some embodiments, the backmetal layer directly contacts a bottom surface of the first ohmic contact, and a contact area between the backmetal layer and the bottom surface of the first ohmic contact is fifty percent or more of an area of the bottom surface.

In some embodiments, the backmetal layer extends on the second surface of the substrate.

In some embodiments, the via extends through the channel layer and the barrier layer.

In some embodiments, a thickness of the substrate is 75 µm or less.

In some embodiments, a largest cross-section of the via in a direction parallel to the first surface of the substrate is less than 16 µm by 40 µm.

In some embodiments, an area of a largest cross-section of the via in a direction parallel to the first surface of the substrate is less than 1000 µm².

In some embodiments, the first ohmic contact is in a recess in the upper surface of the barrier layer.

In some embodiments, the HEMT further includes a drain contact comprising a second ohmic contact on the upper surface of the barrier layer.

In some embodiments, the HEMT further includes a gate contact on the upper surface of the barrier layer, and a first insulating layer on the upper surface of the barrier layer, where a first portion of the gate contact is on the first insulating layer.

In some embodiments, the HEMT further includes a second insulating layer on the first insulating layer and the gate contact.

In some embodiments, the HEMT further includes a field plate on the second insulating layer, wherein at least a portion of the field plate is on a portion of the second insulating layer that is between the gate contact and the drain contact.

In some embodiments, the substrate comprises silicon carbide.

In some embodiments, the barrier layer comprises a first Group III nitride and the channel layer comprises a second Group III nitride, and a first energy of a conduction band edge of the channel layer is less than a second energy of a conduction band edge of the barrier layer at an interface between the channel layer and the barrier layer.

In some embodiments, the HEMT further includes a doped well in the barrier layer adjacent the first ohmic contact.

Pursuant to further embodiments of the present invention, a high electron mobility transistor (HEMT), includes a substrate, a semiconductor structure on the substrate, a first via and a second via, each extending in the substrate and the semiconductor structure, a first ohmic source contact on the first via and a second ohmic source contact on the second via, a drain contact on the semiconductor structure between the first ohmic source contact and the second ohmic source contact, and a gate contact between the first source ohmic contact and the drain contact.

In some embodiments, the first via is between the first ohmic source contact and the substrate.

In some embodiments, a distance between the first ohmic source contact and the second ohmic source contact is 60 μm or less.

In some embodiments, the HEMT further includes a backmetal layer within the first via.

In some embodiments, the backmetal layer directly contacts the first ohmic source contact.

In some embodiments, the backmetal layer directly contacts a bottom surface of the first ohmic source contact, and a contact area between the backmetal layer and the bottom surface of the first ohmic source contact is fifty percent or more of an area of the bottom surface.

In some embodiments, the backmetal layer extends on a surface of the substrate that is opposite the substrate from the semiconductor structure.

In some embodiments, the semiconductor structure comprises a channel layer and a barrier layer on the channel layer.

In some embodiments, the first via extends through the channel layer and the barrier layer.

In some embodiments, a thickness of the substrate is 75 μm or less.

In some embodiments, a largest cross-section of the first via in a direction parallel to a top surface of the substrate is less than 16 μm by 40 μm.

In some embodiments, an area of a largest cross-section of the first via in a direction parallel to a top surface of the substrate is less than 1000 μm².

In some embodiments, the first ohmic source contact is in a recess in an upper surface of the semiconductor structure.

In some embodiments, the HEMT further includes a first insulating layer on the semiconductor structure, wherein a first portion of the gate contact is on the first insulating layer.

In some embodiments, the HEMT further includes a second insulating layer on the first insulating layer and the gate contact.

In some embodiments, the HEMT further includes a field plate on the second insulating layer, wherein at least a portion of the field plate is on a portion of the second insulating layer that is between the gate contact and the drain contact.

Pursuant to still further embodiments of the present invention, a method of forming a high electron mobility transistor (HEMT) includes forming a semiconductor structure on a substrate, the substrate comprising an upper surface and a lower surface on opposing sides of the substrate, forming a source contact comprising a first ohmic contact on an upper surface of the semiconductor structure, and forming a via extending from the lower surface of the substrate to the first ohmic contact.

In some embodiments, the method further includes thinning the substrate.

In some embodiments, a thickness of the substrate is 75 μm or less after thinning the substrate.

In some embodiments, thinning the substrate is performed after forming the first ohmic contact and before forming the via.

In some embodiments, the method further includes depositing a backmetal layer within the via.

In some embodiments, the backmetal layer directly contacts the first ohmic contact.

In some embodiments, the backmetal layer directly contacts a lower surface of the first ohmic contact, and a contact area between the backmetal layer and the lower surface of the first ohmic contact is fifty percent or more of an area of the lower surface of the first ohmic contact.

In some embodiments, the backmetal layer extends on the lower surface of the substrate.

In some embodiments, at least a portion of the via is between the first ohmic contact and the lower surface of the substrate.

In some embodiments, forming the semiconductor structure on the substrate includes forming a channel layer on the substrate and forming a barrier layer on the channel layer.

In some embodiments, a largest cross-section of the via in a direction parallel to the lower surface of the substrate is less than 1000 μm².

In some embodiments, the method further includes forming a first insulating layer on the semiconductor structure, wherein forming the source contact comprises forming the first ohmic contact in the first insulating layer.

In some embodiments, the method further includes forming a drain contact in the first insulating layer and forming a gate contact in the first insulating layer, between the drain contact and the source contact.

In some embodiments, the drain contact comprises a second ohmic contact.

In some embodiments, the method further includes forming a second insulating layer on the first insulating layer and the gate contact.

In some embodiments, the method further includes forming a field plate on the second insulating layer, wherein at least a portion of the field plate is on a portion of the second insulating layer that is between the gate contact and the drain contact.

In some embodiments, the method further includes forming a metal contact in the second insulating layer on at least one of the gate contact, the drain contact, and the source contact.

Pursuant to further embodiments of the present invention, a high electron mobility transistor (HEMT) includes a substrate, a semiconductor structure on the substrate, a first ohmic source contact and a second ohmic source contact on the semiconductor structure, and a drain contact on the semiconductor structure between the first ohmic source contact and the second ohmic source contact, wherein a distance between the first ohmic source contact and the second ohmic source contact is 60 μm or less.

In some embodiments, the HEMT further includes a via extending from a bottom surface of the substrate to the first ohmic source contact.

In some embodiments, the HEMT further includes a backmetal layer within the via.

In some embodiments, the backmetal layer directly contacts the first ohmic source contact.

In some embodiments, the backmetal layer directly contacts a bottom surface of the first ohmic source contact, and a contact area between the backmetal layer and the bottom surface of the first ohmic source contact is fifty percent or more of an area of the bottom surface.

In some embodiments, a largest cross-section of the via in a direction parallel to the bottom surface of the substrate is less than 16 μm by 40 μm.

In some embodiments, an area of a largest cross-section of the via in a direction parallel to the bottom surface of the substrate is less than 1000 μm².

In some embodiments, a thickness of the substrate is 75 μm or less.

DETAILED DESCRIPTION

Embodiments of the present inventive concepts are described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

Embodiments of the present invention are directed to high electron mobility transistors that may exhibit improved device density and switching performance.

Figure 1A:
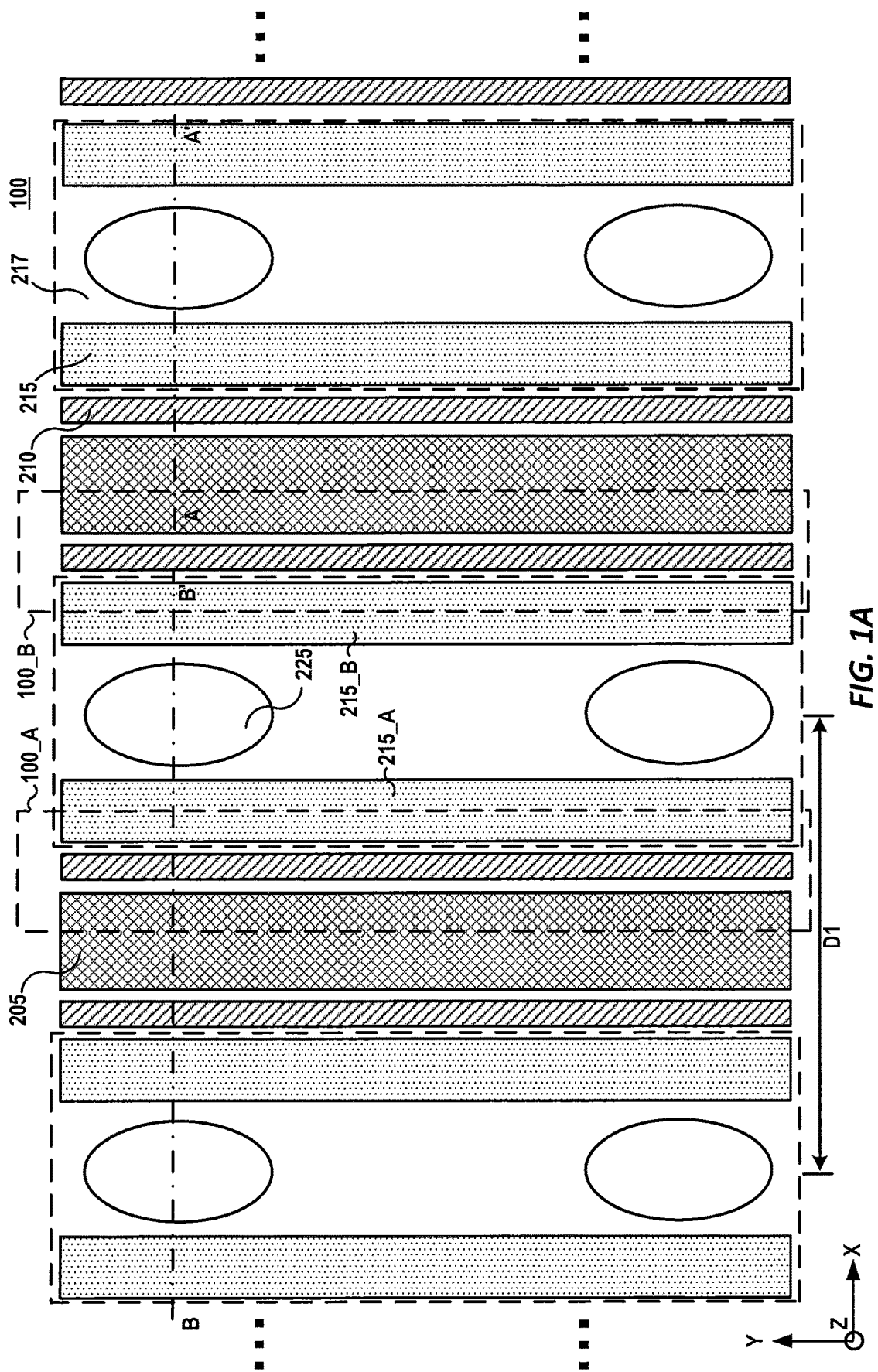
FIG. 1A is a schematic plan view of a conventional high electron mobility transistor.
Figure 1B:
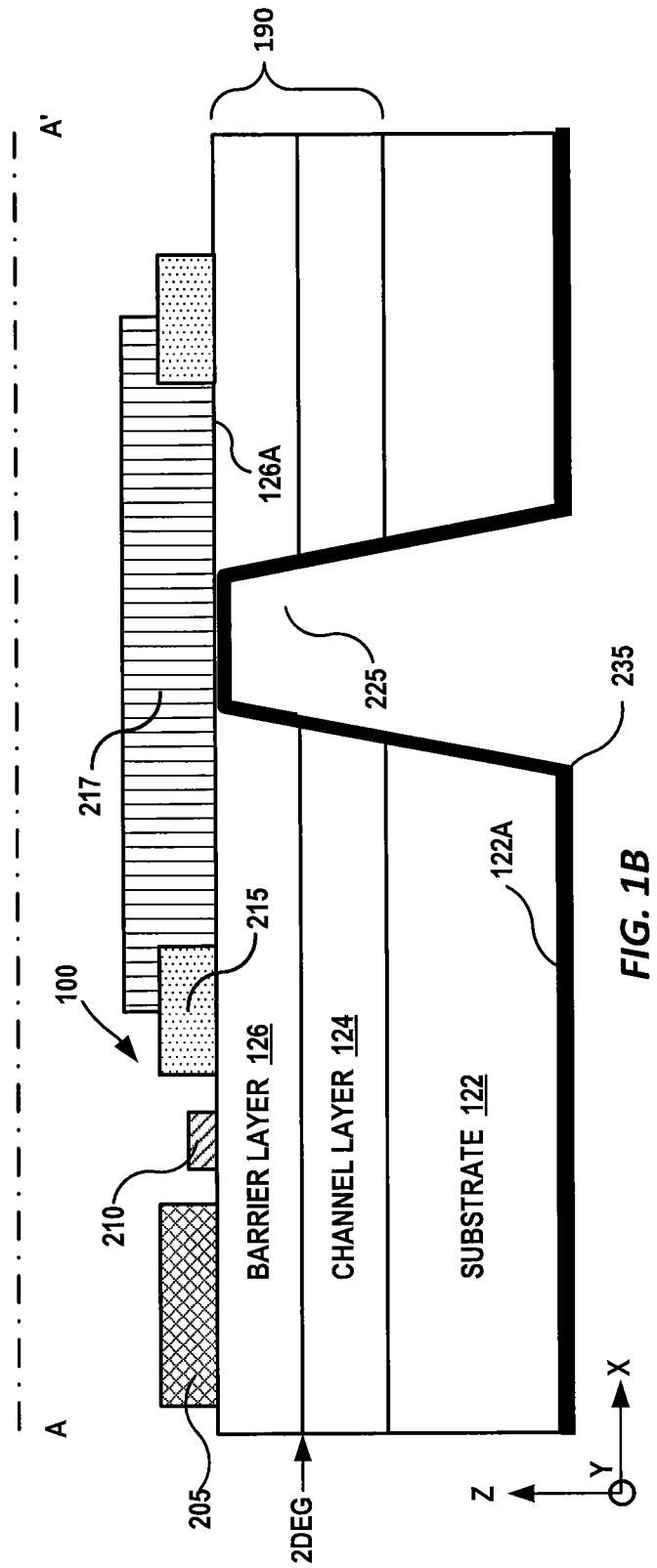
FIG. 1B is a schematic cross-sectional view taken along line A-A' of FIG. 1A.
Figure 1C:
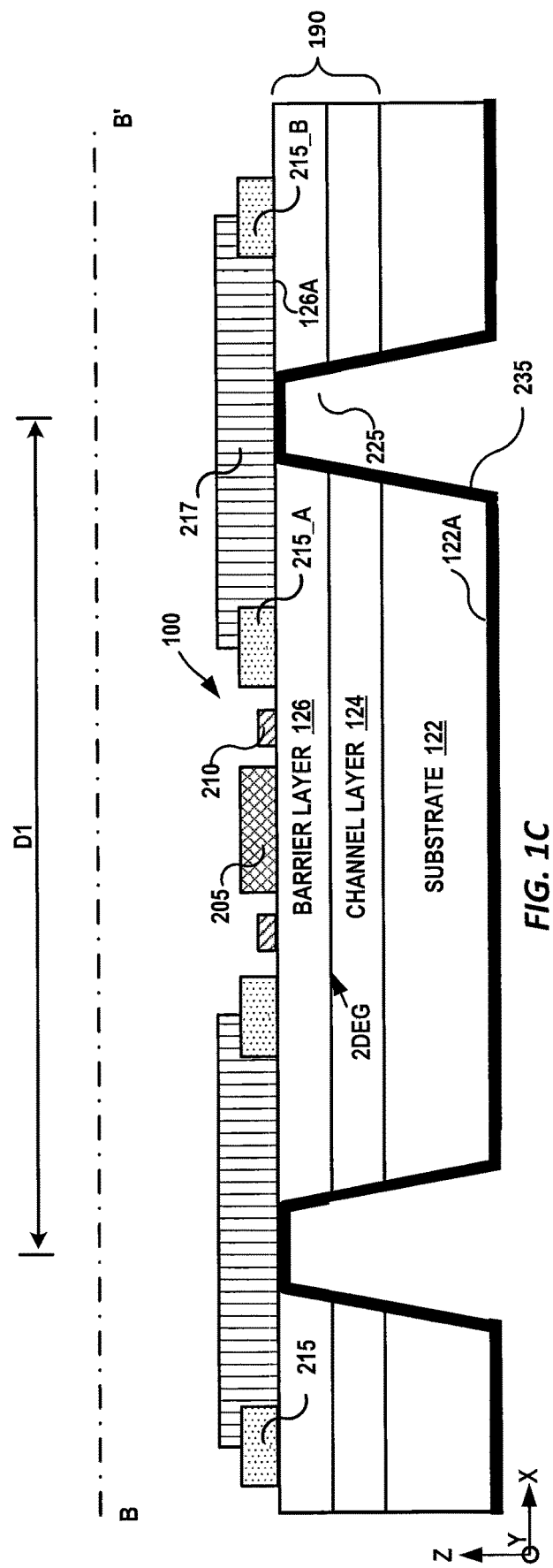
FIG. 1C is a schematic cross-sectional view taken along line B-B' of FIG. 1A.

FIG. 1A is a schematic plan view of a conventional high electron mobility transistor 100, while FIG. 1B is a schematic cross-sectional view of the high electron mobility transistor 100 taken along line A-A' of FIG. 1A and FIG. 1C is a schematic cross-sectional view of the high electron mobility transistor 100 taken along line B-B' of FIG. 1A. As shown in FIGS. 1A-1C, the high electron mobility transistor 100 may be formed on a substrate 122 such as, for example, a silicon carbide substrate. A channel layer 124 is formed on the substrate 122. A barrier layer 126 is formed on the channel layer 124 opposite the substrate 122. The channel layer 124 may include, for example, gallium-nitride (GaN) and the barrier layer 126 may include, for example, aluminum gallium-nitride (AlGaN).

The channel layer 124, and barrier layer 126 may together form a semiconductor structure 190 on the substrate 122. A source contact 215 and a drain contact 205 are formed on an upper surface of the barrier layer 126 and are laterally spaced apart from each other. The source contact 215 and the drain contact 205 may form an ohmic contact to the barrier layer 126.

A gate contact 210 is formed on the upper surface of the barrier layer 126 between the source contact 215 and the drain contact 205. A two-dimensional electron gas (2DEG) layer is formed at a junction between the channel layer 124 and the barrier layer 126 when the HEMT device 100 is biased to be in its conducting or "on" state. The 2DEG layer acts as a highly conductive layer that allows current to flow between the source and drain regions of the device that are beneath the source contact 215 and the drain contact 205, respectively.

The source contact 215 may be coupled to a reference signal such as, for example, a ground voltage. The coupling to the reference signal may be provided by a via 225 that extends from a lower surface 122A of the substrate 122, through the substrate 122 to an upper surface 126A of the barrier layer. A metallization layer 217 may be deposited on the via 225 and on two adjacent source contacts 215 to electrically connect the two adjacent source contacts 215. The metallization layer may be formed of a conductive metal.

The via 225 may expose a surface of the metallization layer 217. A backmetal layer 235 may be formed on the lower surface 122A of the substrate 122 and on side walls of the via 225. The backmetal layer 235 may directly contact the metallization layer 217. Thus, the backmetal layer 235, and a signal coupled thereto, may be electrically connected to the two adjacent source contacts 215.

The HEMT device 100 may be made up of a plurality of transistor unit cells, examples of which are designated as 100_A and 100_B in FIG. 1A. Respective ones of the transistor unit cells 100_A, 100_B may include a source contact 215, a drain contact 205, and a gate contact 210. A first ohmic source contact (e.g., 215_A) of a first one of the transistor unit cells 100_A may be separate from a second ohmic source contact (e.g., 215_B) of a second one of the transistor unit cells 100_B. The source contact 215, drain contact 205, and gate contact 210 may only represent a subset of the total number of source contacts 215, drain contacts 205, and gate contacts 210 of the HEMT device 100.

Referring to FIG. 1A, a size of the resulting HEMT device 100 may be impacted by a source-to-source distance D1 between adjacent ones of the source contacts 215 and/or vias 225. As illustrated in FIGS. 1A and 1C, the distance D1 may be measured (e.g., in the X direction of FIG. 1A) between adjacent ones one of the vias 225 and/or between adjacent ones of the combination of two adjacent source contacts 215 interconnected by the metallization layer 217. The distance D1 may be, in some embodiments, a center-to-center distance. For example, in some embodiments, D1 may be measure from a center of a first via 225 to a center of a second via 225 that is adjacent in the X direction. In conventional devices, the distance D1 may be 120 μm or more.

The present invention results from a realization that a dimension of a semiconductor device may be decreased by directly connecting a via to a source contact without the requirement of an interconnecting metallization layer, such as the interconnecting metallization layer 217 illustrated in FIGS. 1B and 1C. The substrate may also be thinned to allow for a reduction in the horizontal cross-sectional area of the via, further reducing the area of the device. In addition to the density improvements that may result from reducing the area of the device, an overall parasitic capacitance may also be decreased. A reduced parasitic capacitance may lead to additional improvements in switching frequency of the resulting circuit.

Figure 2A:
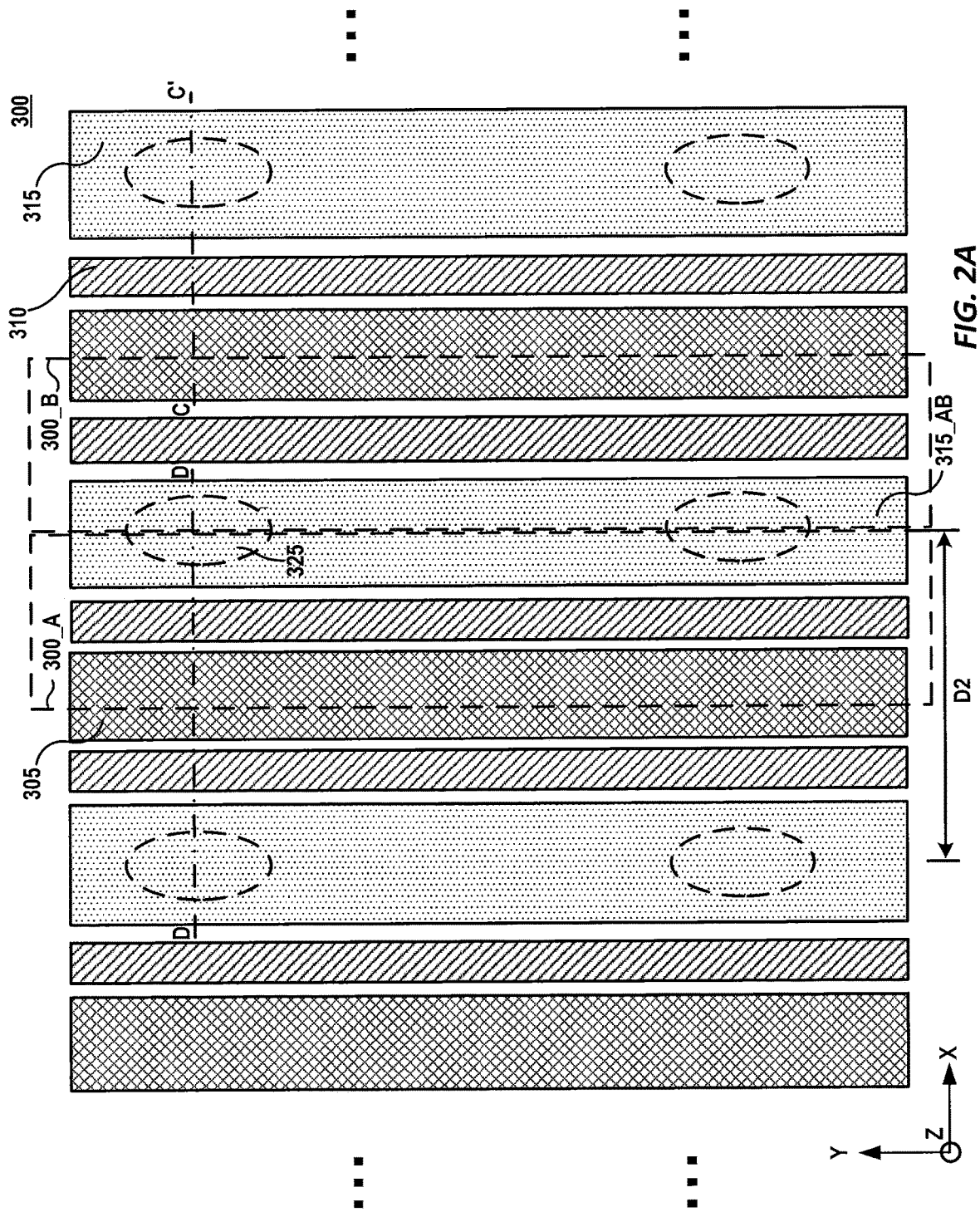
FIG. 2A is a schematic plan view of a HEMT device according to embodiments of the present invention.
Figure 2B:
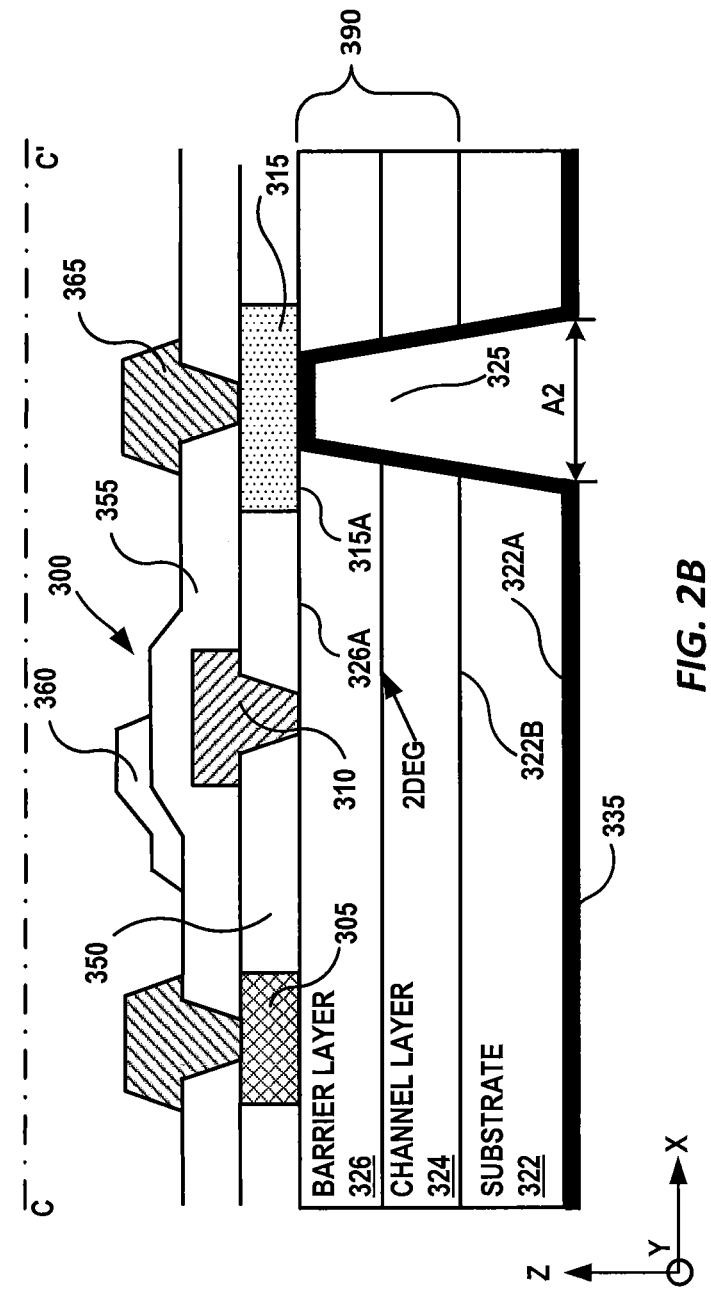
FIG. 2B is a schematic cross-sectional view of the HEMT device taken along line C-C' of FIG. 2A.
Figure 2C:
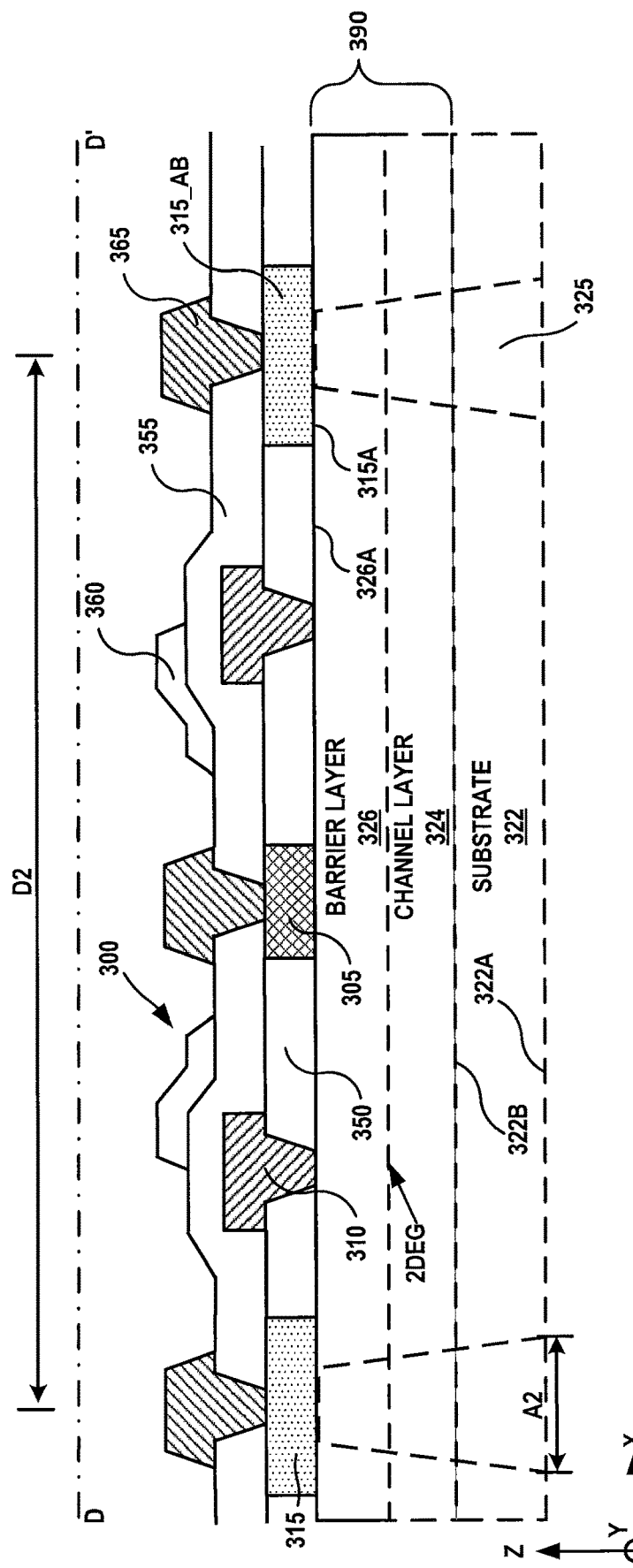
FIG. 2C is a schematic cross-sectional view of the HEMT device taken along line D-D' of FIG. 2A.

FIG. 2A is a schematic plan view of a HEMT device 300 according to embodiments of the present invention, while FIG. 2B is a schematic cross-sectional view of the HEMT device 300 taken along line C-C' of FIG. 2A and FIG. 2C is a schematic cross-sectional view of the HEMT device 300 taken along line D-D' of FIG. 2A. FIGS. 2A, 2B, and 2C are intended to represent structures for identification and description and are not intended to represent the structures to physical scale. In addition, though FIGS. 2A, 2B, and 2C are illustrated so as to allow for general comparison with the structures of FIGS. 1A, 1B, and 1C, it will be understood that the scale of FIGS. 2A-2C is not intended to be identical to that of FIGS. 1A-1C.

As shown in FIGS. 2A-2C, a semiconductor structure 390, such as a semiconductor structure for a Group III nitride semiconductor HEMT, may be formed on a substrate 322 such as a silicon carbide SiC substrate or a sapphire substrate. The substrate 322 may be a semi-insulating silicon carbide (SiC) substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Cree, Inc. The term "semi-insulating" is used descriptively herein, rather than in an absolute sense.

As used herein, the term "Group III-nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements.

In some embodiments of the present invention, the silicon carbide bulk crystal of the substrate 322 may have a resistivity equal to or higher than about $1 \times 10^5$ ohm-cm at room temperature. Exemplary SiC substrates that may be used in some embodiments of the present invention are manufactured by, for example, Cree, Inc., of Durham, N.C., the assignee of the present invention, and methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although silicon carbide may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 322 may be a silicon carbide wafer, and the HEMT device 300 may be formed, at least in part, via wafer-level processing, and the wafer may then be diced to provide a plurality of individual high electron mobility transistors 300.

The substrate 322 may have a lower surface 322A and an upper surface 322B. In some embodiments, the substrate 322 of the HEMT device 300 may be a thinned substrate 322. In some embodiments, the thickness of the substrate 322 (e.g., in a vertical Z direction in FIG. 2B) may be 100 μm or less. In some embodiments, the thickness of the substrate 322 may be 75 μm or less. In some embodiments, the thickness of the substrate 322 may be 50 μm or less.

A channel layer 324 is formed on the upper surface 322B of the substrate 322 (or on the optional layers described further herein), and a barrier layer 326 is formed on an upper surface of the channel layer 324. The channel layer 324 and the barrier layer 326 may each be formed by epitaxial growth in some embodiments. Techniques for epitaxial growth of Group III nitrides have been described in, for example, U.S. Pat. Nos. 5,210,051, 5,393,993, and 5,523,589, the disclosures of which are also incorporated by reference herein in their entireties. The channel layer 324 may have a bandgap that is less than the bandgap of the barrier layer 326 and the channel layer 324 may also have a larger electron affinity than the barrier layer 326. The channel layer 324 and the barrier layer 326 may include Group III-nitride based materials.

In some embodiments, the channel layer 324 may be a Group III nitride, such as $Al_xGa_{1-x}N$, where $0 \leq x < 1$, provided that the energy of the conduction band edge of the channel layer 324 is less than the energy of the conduction band edge of the barrier layer 326 at the interface between the channel and barrier layers 324, 326. In certain embodiments of the present invention, x=0, indicating that the channel layer 324 is GaN. The channel layer 324 may also be other Group III-nitrides such as InGaN, AlInGaN or the like. The channel layer 324 may be undoped ("unintentionally doped") and may be grown to a thickness of greater than about 0.002 μm. The channel layer 324 may also be a multi-layer structure, such as a superlattice or combinations of GaN, AlGaN or the like. The channel layer 324 may be under compressive strain in some embodiments.

In some embodiments, the barrier layer 326 is AlN, AlInN, AlGaN or AlInGaN or combinations of layers thereof. The barrier layer 326 may comprise a single layer or may be a multi-layer structure. In particular embodiments of the present invention, the barrier layer 326 may be thick enough and may have a high enough aluminum (Al) composition and doping to induce a significant carrier concentration at the interface between the channel layer 324 and the barrier layer 326 through polarization effects when the barrier layer 326 is buried under ohmic contact metal. The barrier layer 326 may, for example, be from about 0.1 nm to about 30 nm thick, but is not so thick as to cause cracking or substantial defect formation therein. Barrier layer thicknesses in the range of 15-30 nm are common. In certain embodiments, the barrier layer 326 is undoped or doped with an n-type dopant to a concentration less than about $10^{19}$ $cm^{-3}$. In some embodiments of the present invention, the barrier layer 326 is $Al_xGa_{1-x}N$ where $0<x<1$. In particular embodiments, the aluminum concentration is about 25%. However, in other embodiments of the present invention, the barrier layer 326 comprises AlGaN with an aluminum concentration of between about 5% and less than about 100%. In specific embodiments of the present invention, the aluminum concentration is greater than about 10%. The channel layer 324 and/or the barrier layer 326 may be deposited, for example, by metal-organic chemical vapor deposition (MOCVD), molecular beam epitaxy (MBE), or hydride vapor phase epitaxy (HVPE). As discussed above with respect to the conventional HEMT device 100, a 2DEG layer is induced in the channel layer 324 at a junction between the channel layer 324 and the barrier layer 326. The 2DEG layer acts as a highly conductive layer that allows conduction between the source and drain regions of the device that are beneath the source contact 315 the drain contact 305, respectively. The channel layer 324 and the barrier layer 326 form the semiconductor structure 390.

While semiconductor structure 390 is shown with channel layer 324 and barrier layer 326 for purposes of illustration, semiconductor structure 390 may include additional layers/structures/elements such as a buffer and/or nucleation layer(s) between channel layer 324 and substrate 322, and/or a cap layer on barrier layer 326. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, 7,548,112, and 7,709,269, the disclosures of which are hereby incorporated herein in their entirety by reference. For example, an MN buffer layer may be formed on the upper surface 322B of the substrate 322 to provide an appropriate crystal structure transition between the silicon carbide substrate 322 and the remainder of the HEMT device 300. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HVPE.

A source contact 315 and a drain contact 305 may be formed on an upper surface 326A of the barrier layer 326 and may be laterally spaced apart from each other. A gate contact 310 may be formed on the upper surface 326A of the barrier layer 326 between the source contact 315 and the drain contact 305. The material of the gate contact 310 may be chosen based on the composition of the barrier layer 326, and may, in some embodiments, be a Schottky contact. Conventional materials capable of making a Schottky contact to a gallium nitride based semiconductor material may be used, such as, for example, nickel (Ni), platinum (Pt), nickel silicide (NiSi$_x$), copper (Cu), palladium (Pd), chromium (Cr), tungsten (W) and/or tungsten silicon nitride (WSiN).

The source contact 315 and the drain contact 305 may include a metal that can form an ohmic contact to a gallium nitride based semiconductor material. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), NiSi$_x$, titanium silicide (TiSi), titanium nitride (TiN), WSiN, Pt and the like. In some embodiments, the source contact 315 may be an ohmic source contact 315. Thus, the source contact 315 and the drain contact 305 may contain an ohmic contact portion in direct contact with the barrier layer 326. In some embodiments, the source contact 315 and/or the drain contact 305 may be formed of a plurality of layers to form an ohmic contact that may be provided as described, for example, in commonly assigned U.S. Pat. Nos. 8,563,372 and 9,214,352, the disclosures of which are hereby incorporated herein in their entirety by reference.

The source contact 315 may be coupled to a reference signal such as, for example, a ground voltage. The coupling to the reference signal may be provided by a via 325 that extends from a lower surface 322A of the substrate 322, through the substrate 322 to an upper surface 326A of the barrier layer. The via 325 may expose a bottom surface of the ohmic portion 315A of the source contact 315. A backmetal layer 335 may be formed on the lower surface 322A of the substrate 322 and on side walls of the via 325. The backmetal layer 335 may directly contact the ohmic portion 315A of the source contact 315. In some embodiments a contact area between the backmetal layer 335 and the bottom surface of the ohmic portion 315A of the source contact 315 may be fifty percent or more of an area of the bottom surface of the ohmic portion 315A of the source contact 315. Thus, the backmetal layer 335, and a signal coupled thereto, may be electrically connected to the source contact 315.

In some embodiments, as illustrated in FIG. 2A, the via 325 may have an oval or circular cross-section when viewed in a plan view. However, the present invention is not limited thereto. In some embodiments, a cross-section of the via 325 may be a polygon or other shape, as will be understood by one of ordinary skill in the art. In some embodiments, dimensions of the via (e.g., a length and/or a width) may be such that a largest cross-sectional area A2 of the via 325 is 1000 μm$^2$ or less. The cross-sectional area A2 may be taken in a direction that is parallel to the lower surface 322A of the substrate 322 (e.g., the X-Y plane of FIG. 2B). In some embodiments, the largest cross-sectional area A2 of the via 325 may be that portion of the via 325 that is adjacent the lower surface 322A of the substrate 322 (e.g., the opening of the via 325). For example, in some embodiments, a greatest width (e.g., in the X direction in FIG. 2A) may be 16 μm and a greatest length (e.g., in the Y direction in FIG. 2A) may be 40 μm, though the present invention is not limited thereto. The largest cross-sectional area A2 of the via 325 according to embodiments of the present invention may be reduced from that of the conventional device (such as that illustrated in FIGS. 1A-1C), where the largest cross-sectional area of the via may be 35 μm by 75 μm or larger. In some embodiments, the reduction in the cross-sectional area A2 of the via 325 may be accomplished at least in part based on the reduced thickness of the substrate 322. In some embodiments, sidewalls of the via 325 may be inclined and/or slanted with respect to the lower surface 322A of the substrate 322.

In some embodiments, the source contact 315, the drain contact 305, and the gate contact 310 may be formed as a plurality of source contacts 315, drain contacts 305, and gate contacts 310 on the substrate 322. Referring to FIG. 2A, a plurality of drain contacts 305 and source contacts 315 may be alternately arranged on the substrate 322. A gate contact 310 may be disposed between adjacent drain contacts 305 and source contacts 315 to form a plurality of transistor unit cells, examples of which are designated as 300_A and 300_B in FIG. 2A. Respective ones of the transistor unit cells 300_A, 300_B may include a source contact 315, a drain contact 305, and a gate contact 310. An ohmic source contact (e.g., 315_AB) of a first one of the transistor unit cells 300_A may be shared with of a second one of the transistor unit cells 300_B. FIG. 2A illustrates a subset of the source contacts 315, drain contacts 305, and gate contacts 310 for ease of discussion, but it will be understood that the HEMT device 300 may have additional structures, including additional source contacts 315, drain contacts 305, and gate contacts 310, that are not illustrated in FIG. 2A.

In some embodiments, each of the a plurality of source contacts 315, drain contacts 305, and gate contacts 310 on the substrate 322 may extend in a first direction (e.g., the Y direction of FIG. 2A). A distance D2 measured (e.g., in the X direction of FIGS. 2A and 2C) between adjacent source contacts 315 with at least one drain contact 305 therebetween may be reduced from the conventional HEMT device, such as the HEMT device 100 illustrated in FIGS. 1A and 1B. In some embodiments, the distance D2 between adjacent source contacts 315 having a drain contact 305 therebetween may be 90 μm or less. In some embodiments, the distance D2 between adjacent source contacts 315 having a drain contact 305 therebetween may be 75 μm or less. In some embodiments, the distance D2 between adjacent source contacts 315 may be 60 μm or less. In some embodiments, the distance D2 between adjacent source contacts 315 may be 50 μm or less. In some embodiments, a plurality of vias 325 may be connected to respective ones of the source contacts 315. The distance D2 may be, in some embodiments, a center-to-center distance between the source contacts 315 and/or the vias 325. For example, in some embodiments, the distance D2 may be measured from a center (e.g., in the X direction) of a first source contact 315 to a center of a second source contact 315 that is adjacent in the X direction. The distance D2 may extend from the center of the first source contact 315, across a drain contact 305, to the center of the second source contact 315. In some embodiments, the distance D2 may extend from a center of an ohmic portion of the first source contact 315 to a center of an ohmic portion of the second source contact 315 that is adjacent in the X direction. In some embodiments, D2 may be measured from a center of a first via 325 that is connected to the first source contact 315 to a center of a second via 325 that is connected to the second source contact 315 that is adjacent in the X direction.

As will be understood by one of ordinary skill in the art, a HEMT transistor may be formed by the active region between the source contact 315 and the drain contact 305 under the control of a gate contact 310 between the source contact 315 and the drain contact 305. As illustrated in FIG. 2A, the HEMT device 300 may include adjacent HEMT unit transistors 300_A, 300_B sharing a source contact 315. By sharing the source contact 315 between adjacent HEMT transistors and reducing a size of the via 325, the distance D2 measured between adjacent source contacts 315 with at least one drain contact 305 therebetween may be reduced from the source to source distance (see FIGS. 1A and 1C, D1) of the conventional HEMT device 100.

In some embodiments, a width of the source contact 315 and/or source region may also be reduced from the conventional HEMT device 100. In some embodiments, for example, a width of the source contact 315 (e.g., in the X direction of FIGS. 2A-2C) may be within 75% to 125% of the width of the drain contact 305. In other words, by reducing the size of the via 325, a width of the source contact 315 may be reduced between two adjacent gate contacts 310.

Referring again to FIGS. 2B and 2C, the HEMT device 300 may include a first insulating layer 350 and a second insulating layer 355. The first insulating layer 350 may directly contact the upper surface of the semiconductor structure 390 (e.g., contact the upper surface 326A of the barrier layer 326). The second insulating layer 355 may be formed on the first insulating layer 350. It will also be appreciated that more than two insulating layers may be included in some embodiments. The first insulating layer 350 and the second insulating layer 355 may serve as passivation layers for the HEMT device 300.

The source contact 315, the drain contact 305, and the gate contact 310 may be formed in the first insulating layer 350. In some embodiments, at least a portion of the gate contact 310 may be on the first insulating layer. In some embodiments, the gate contact 310 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 355 may be formed on the first insulating layer 350 and on portions of the drain contact 305, gate contact 310, and source contact 315.

Field plates 360 may be formed on the second insulating layer 355. At least a portion of a field plate 360 may be on the gate contact 310. At least a portion of the field plate 360 may be on a portion of the second insulating layer 355 that is between the gate contact 310 and the drain contact 305. The field plate 360 can reduce the peak electric field in the HEMT device 300, which can result in increased breakdown voltage and reduced charge trapping. The reduction of the electric field can also yield other benefits such as reduced leakage currents and enhanced reliability. Field plates and techniques for forming field plates are discussed, by way of example, in U.S. Pat. No. 8,120,064, the disclosure of which is hereby incorporated herein in its entirety by reference.

Metal contacts 365 may be disposed in the second insulating layer 355. The metal contacts 365 may provide interconnection between the drain contact 305, gate contact 310, and source contact 315 and other parts of the HEMT device 300. Respective ones of the metal contacts 365 may directly contact respective ones of the drain contact 305 and/or source contact 315. The metal contacts 365 may contain metal or other highly conductive material, including, for example, copper, cobalt, gold, and/or a composite metal. For ease of illustration, the second insulating layer 355, the field plates 360, and the metal contacts 365 are not illustrated in FIG. 2A.

The HEMT device 300 of FIGS. 2A, 2B, and 2C results in a grouping of HEMT transistors having a reduced spacing. By sharing the source contact 315 between adjacent ones of the HEMT transistors and reducing a size of the via 325 connecting the source contact 315 to the backmetal layer 335, a spacing between adjacent source contacts 315 of the HEMT transistors may be reduced. A reduction of the spacing may result in a decrease in the overall parasitic capacitance of the HEMT device 300. A reduced parasitic capacitance may lead to additional improvements in switching frequency of the HEMT device 300.

In FIG. 2C, for ease of discussion, the backmetal layer 335 is omitted and the structure of the vias 325 and semiconductor structure 390 are illustrated as dashed lines. One of ordinary skill in the art will recognize that the reduced spacing D2 between adjacent source contacts may be achieved using an alternate configuration of the vias 325 and/or the semiconductor structure 390 than that illustrated in FIGS. 2A-2C.

Figure 3:
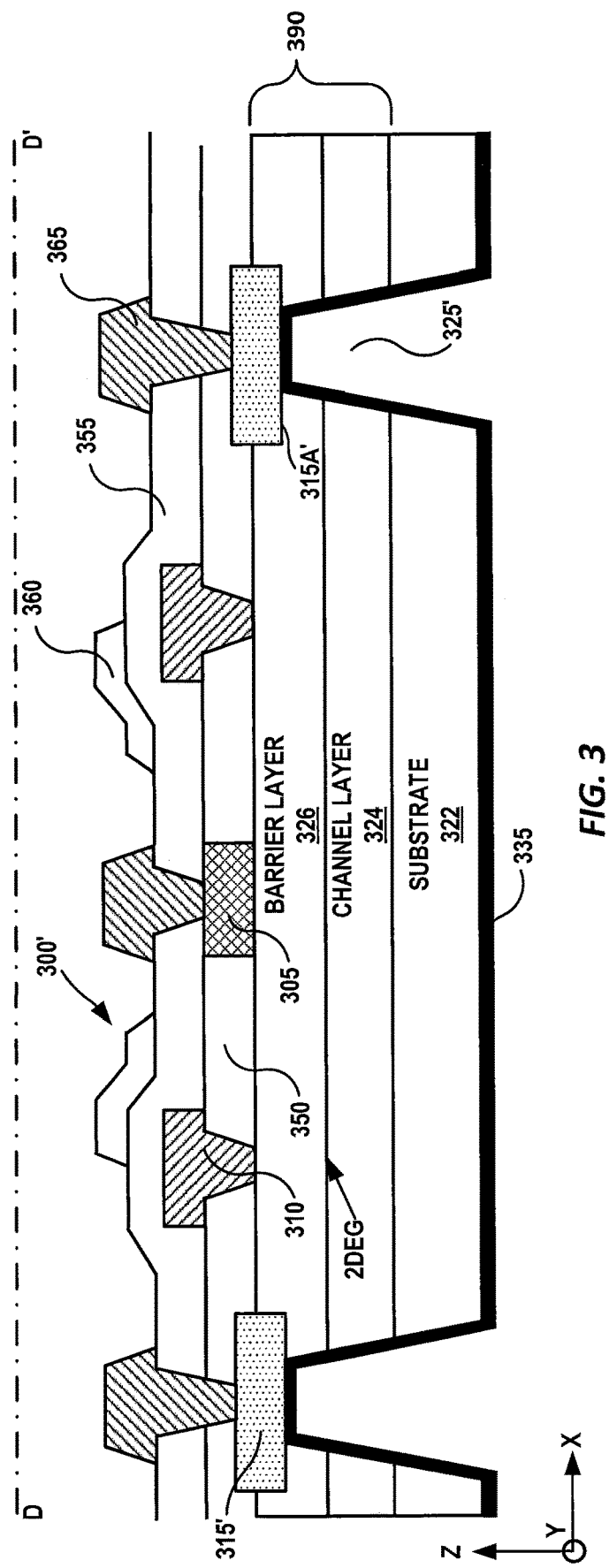
FIG. 3 is a schematic cross-sectional view of an additional embodiment of a HEMT device taken along line D-D' of FIG. 2A, according to embodiments of the present invention.

FIG. 3 is a schematic cross-sectional view of an additional embodiment of a HEMT device 300' taken along line D-D' of FIG. 2A, according to embodiments of the present invention. Portions of FIG. 3 are substantially the same or similar as those illustrated in FIGS. 2B and 2C, and a repeat description thereof will be omitted for brevity. The HEMT device 300' may share a substantially similar plan view as that of the HEMT device 300 of FIG. 2A and, as such, a duplicate illustration thereof is omitted.

Referring to FIG. 3, the HEMT device 300' may have source contacts 315' that are recessed with respect to a surface of the barrier layer 326. A bottom surface 315A' of the ohmic portion of the source contact 315' may be lower (e.g., nearer the substrate 322) than an uppermost surface of the barrier layer 326. Sidewalls and/or lateral surfaces of the source contact 315' may be in contact with portions of the barrier layer 326. In some embodiments, as illustrated in FIG. 3, the via 325 may extend through the barrier layer 326 to directly contact the bottom surface 315A' of the ohmic portion of the source contact 315'. An uppermost portion of the backmetal layer 335 within the via 325' (e.g., a portion of the backmetal layer 335 that is farthest from the substrate 322) may be lower than an upper surface 326A of the barrier layer 326. The uppermost portion of the backmetal layer 335 may directly contact the bottom surface 315A' of the ohmic portion of the source contact 315'.

Though only the source contact 315 is illustrated as being recessed in FIG. 3, the present invention is not limited thereto. In some embodiments, the gate contact 310 and/or the drain contact 305 may also be recessed with respect to the top surface of the barrier layer 326.

FIGS. 4A to 4I illustrate a method of fabricating a HEMT device, such as the HEMT device 300 of FIGS. 2A, 2B, and 2C, according to embodiments of the present invention.

Figure 4A:
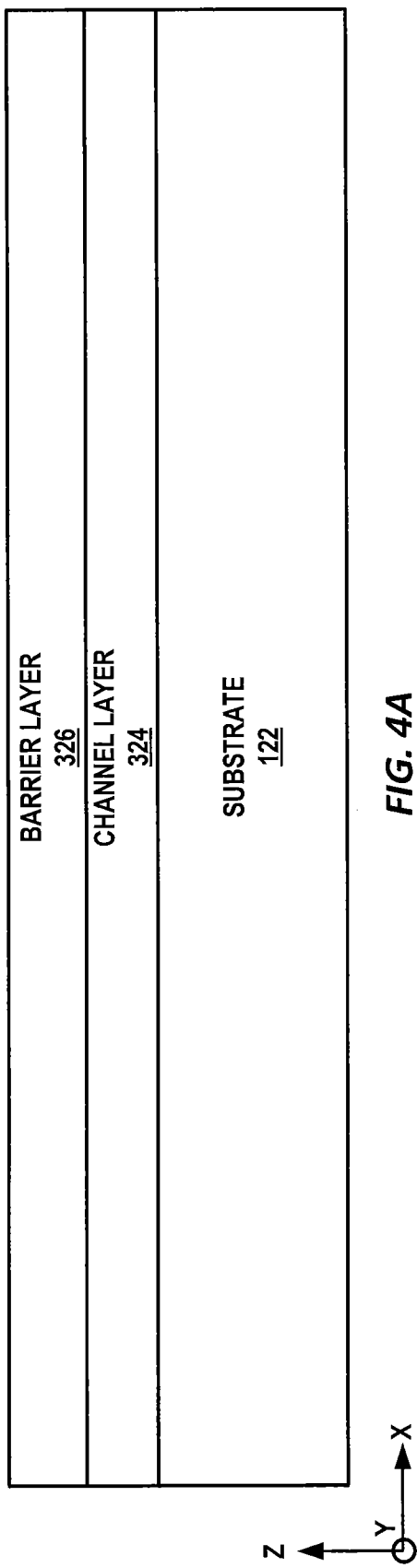
FIGS. 4A to 4I illustrate a method of fabricating a HEMT device, according to embodiments of the present invention.

Referring now to FIG. 4A, a substrate 122 is provided on which a semiconductor structure may be formed. A channel layer 324 is formed on the substrate 122, and a barrier layer 326 is formed on the channel layer 324. The substrate 122 may be a semi-insulating silicon carbide (SiC) substrate that may be, for example, the 4H polytype of silicon carbide. Other silicon carbide candidate polytypes may include the 3C, 6H, and 15R polytypes. A thickness of the substrate 122 may be 100 µm or greater.

Silicon carbide has a much closer crystal lattice match to Group III nitrides (which may be employed in the channel layer 324 and/or the barrier layer 326) than does sapphire ($Al_2O_3$), which may be a common substrate material for Group III nitride devices. The closer lattice match may result in Group III nitride films of higher quality than those generally available on sapphire. Silicon carbide also has a relatively high thermal conductivity, and as such, the total output power of Group III nitride devices formed on silicon carbide may not be as limited by thermal dissipation of the substrate as similar devices formed on sapphire and/or silicon. Also, semi-insulating silicon carbide substrates may provide for device isolation and reduced parasitic capacitance.

It is to be understood that, although silicon carbide may be employed as a substrate, embodiments of the present invention may utilize any suitable substrate for the substrate 122, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like.

Optional buffer, nucleation and/or transition layers (not shown) may also be provided on the substrate 122. For example, an AlN buffer layer may be provided to provide an appropriate crystal structure transition between a silicon carbide substrate and the remainder of the device. Additionally, strain balancing transition layer(s) may also be provided.

Still referring to FIG. 4A, a channel layer 324 is provided on the substrate 122. The channel layer 324 may be deposited on the substrate 122 using buffer layers, transition layers, and/or nucleation layers as described above. The channel layer 324 may be under compressive strain. Furthermore, the channel layer 324 and/or buffer, nucleation, and/or transition layers may be deposited by MOCVD, MBE, and/or HVPE. In some embodiments of the present invention, the channel layer 324 may be a Group III-nitride layer.

The barrier layer 326 may be a Group III-nitride layer. In certain embodiments of the present invention, the barrier layer 326 may be a highly-doped n-type layer. For example, the barrier layer 326 may be doped to a concentration of less than about $10^{19}$ cm$^{-3}$.

In some embodiments of the present invention, the barrier layer 326 may have a thickness, Al composition, and/or doping sufficient to induce a significant carrier concentration at the interface between the channel layer 324 and the barrier layer 326 through polarization effects when the barrier layer 326 is buried under ohmic contact metal. Also, the barrier layer 326 may be thick enough to reduce or minimize scattering of electrons in the channel due to ionized impurities deposited at the interface between the barrier layer 326 and a subsequently formed first protective layer.

In some embodiments, the channel layer 324 and the barrier layer 326 may have different lattice constants. For example, the barrier layer 326 may be a relatively thin layer having a smaller lattice constant than the channel layer 324, such that the barrier layer 326 "stretches" at the interface between the two. Accordingly, a pseudomorphic HEMT (pHEMT) device may be provided.

Figure 4B:
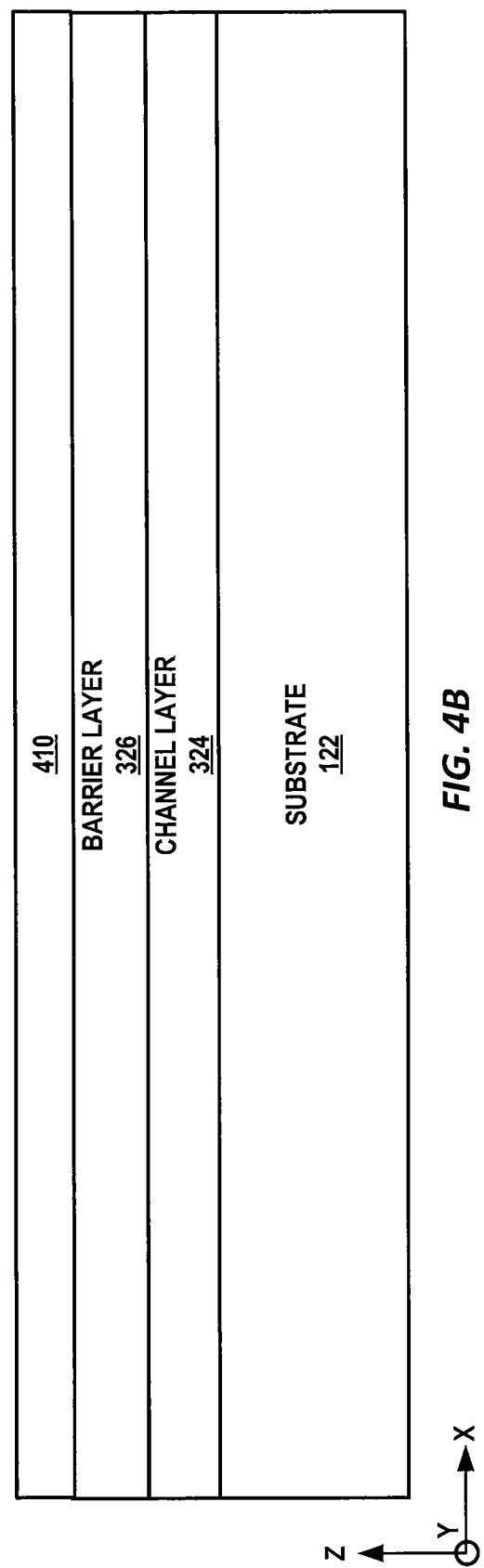

Referring to FIG. 4B, a first protective layer 410 is formed on the barrier layer 326. The first protective layer 410 may be dielectric material, such as silicon nitride ($Si_xN_y$), aluminum nitride (AlN), silicon dioxide ($SiO_2$), and/or other suitable protective material. Other materials may also be utilized for the first protective layer 410. For example, the first protective layer 410 may also include magnesium oxide, scandium oxide, aluminum oxide and/or aluminum oxynitride. Furthermore, the first protective layer 410 may be a single layer or may include multiple layers of uniform and/or non-uniform composition.

The first protective layer 410 may be blanket formed on the barrier layer 326. For example, the first protective layer 410 may be a silicon nitride (SiN) layer formed by high quality sputtering and/or plasma-enhanced chemical vapor deposition (PECVD), The first protective layer 410 may be sufficiently thick so as to protect the underlying barrier layer 326 during a subsequent anneal of ohmic contacts.

Figure 4C:
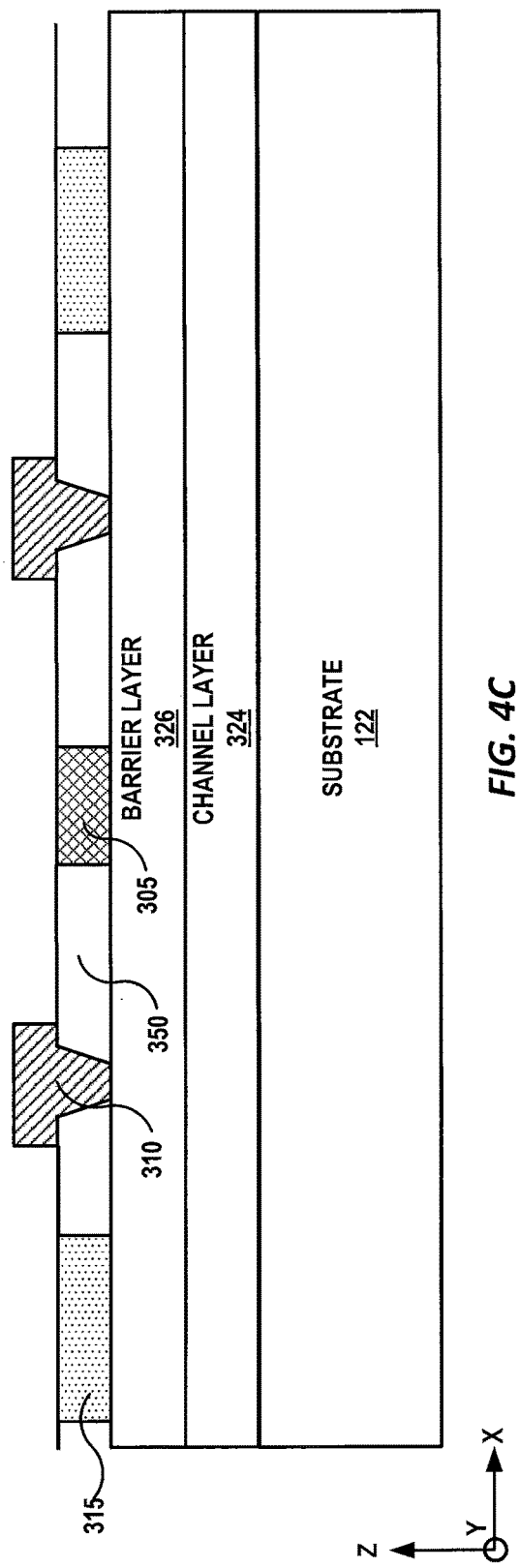

Referring to FIG. 4C, the first protective layer 410 (see FIG. 4B) may be patterned to form source contacts 315, gate contacts 310, and drain contacts 305. For example, the first protective layer 410 may be patterned to form windows which expose the barrier layer 326 for placement of the source contact 315 and the drain contacts 305. The windows may be etched utilizing a patterned mask and a low-damage etch with respect to the barrier layer 326. Ohmic metal may be formed on the exposed portions of the barrier layer 326. The ohmic metal may be annealed to provide the source contacts 315 and the drain contacts 305.

The first protective layer 410 may also be patterned to provide the gate contacts 310. The first protective layer 410 may be etched to form windows which expose the barrier layer 326 for placement of the gate contact 310. The gate contacts 310 may be formed within the etched windows, and may extend through the first protective layer 410 to contact the exposed portion of the barrier layer 326. Suitable gate materials may depend on the composition of the barrier layer 326. However, in certain embodiments, conventional materials capable of making a Schottky contact to a nitride based semiconductor material may be used, such as Ni, Pt, $NiSi_x$, Cu, Pd, Cr, TaN, W, and/or WSiN. Portion of the gate contacts 310 may extend on a surface of the first protective layer 410. The formation of the source contacts 315, gate contacts 310, and drain contacts 305 may result in the patterning of the first protective layer 410 of FIG. 4B to form the first insulating layer 350.

Though the source contact 315 is illustrated as being on the top surface of the barrier layer 326 in FIG. 4C, it will be understood that the source contacts 315, gate contacts 310, and/or drain contacts 305 may be formed within recesses in the top surface of the barrier layer 326. Such a configuration may result in an embodiment similar to that illustrated in FIG. 3.

Figure 4D:
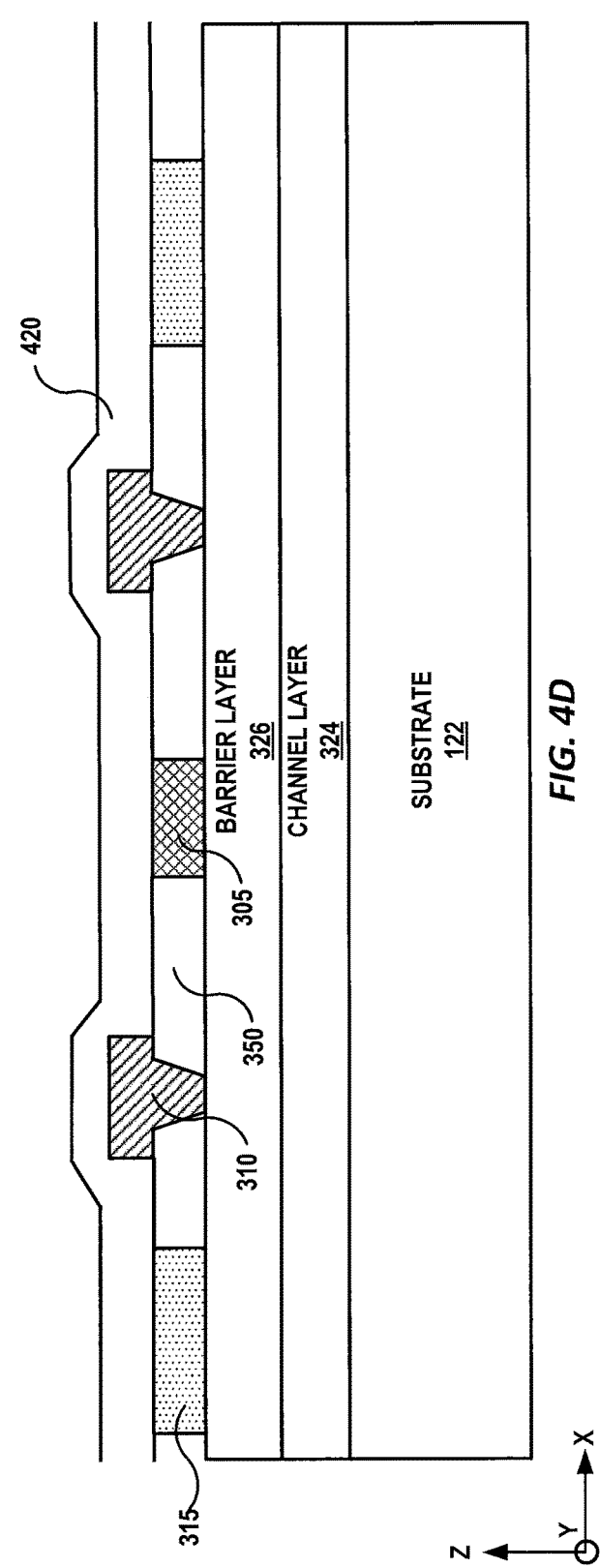

Referring to FIG. 4D, a second protective layer 420 may be formed on the first insulating layer 350, the source contacts 315, gate contacts 310, and drain contacts 305. The second protective layer 420 may be a dielectric layer. In some embodiments, the second protective layer 420 may have a different dielectric index than the first insulating layer 350.

Figure 4E:
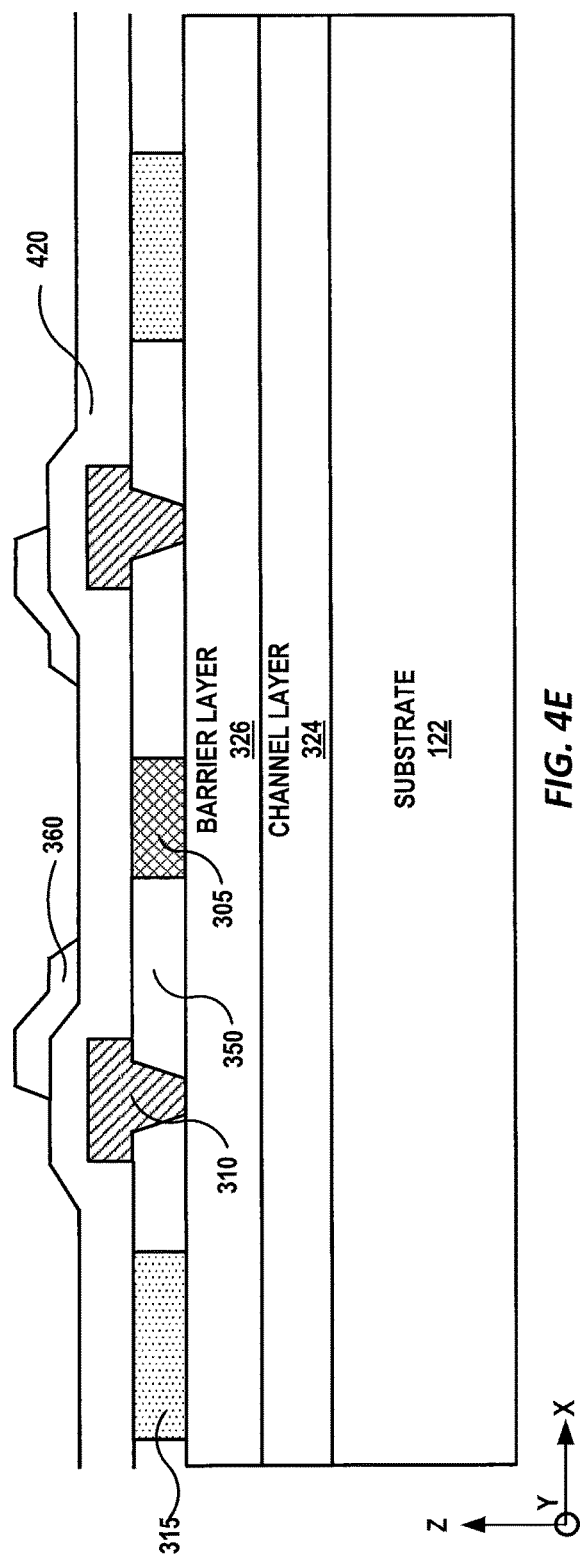

Referring to FIG. 4E, field plates 360 may be formed on the second protective layer 420. The field plate 360 may overlap the gate contact 310 (e.g., in the Z direction of FIG. 4E) and may extend a distance on the region between the gate and the drain (i.e., the gate-drain region). An overlap of the field plate 360 over the gate contact 310 and the distance the field plate 360 extends on the gate-drain region can be varied for optimum results. In some embodiments, the field plate 360 can be electrically connected to gate contact 310, and it is understood that field plate structures other than those illustrated in the figures may be used without deviating from the invention.

Figure 4F:
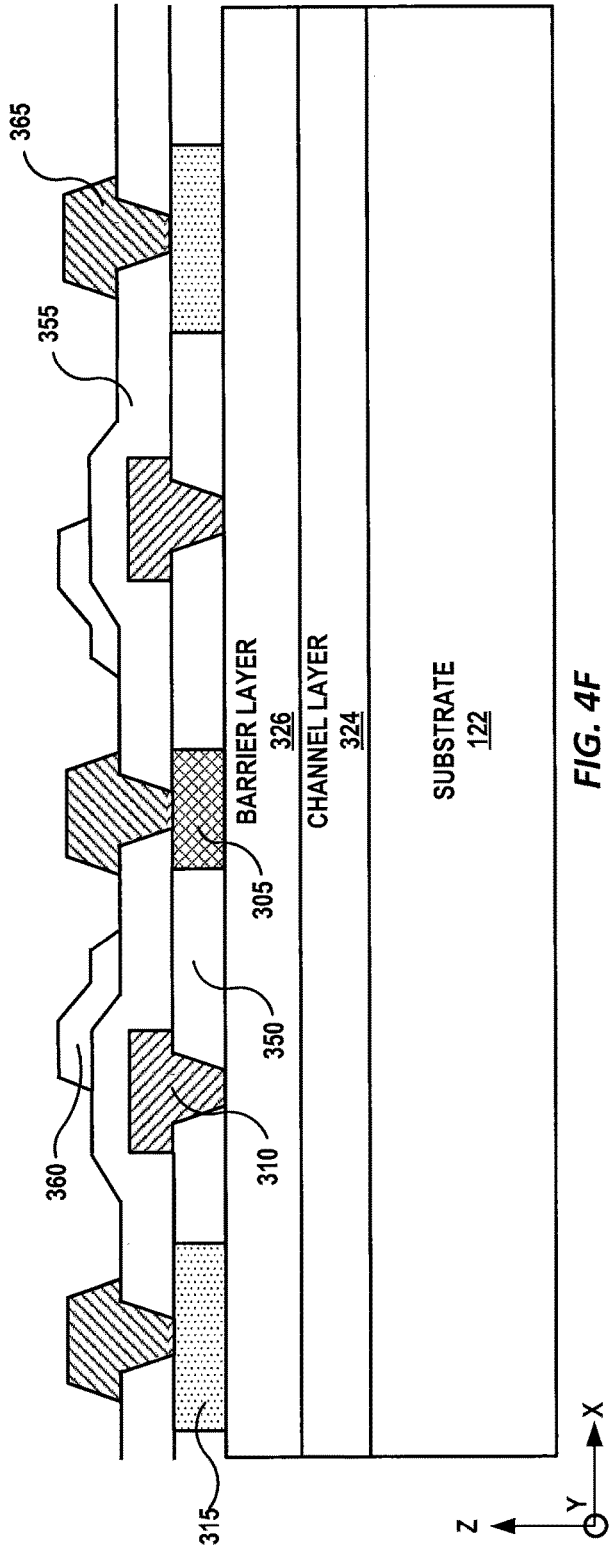

Referring to FIG. 4F, the second protective layer 420 may be patterned to form the metal contacts 365. For example, the second protective layer 420 may be patterned to form windows which expose the source contacts 315 and/or the drain contacts 305 for placement of the metal contacts 365. The windows may be etched utilizing a patterned mask and a low-damage etch with respect to the source contacts 315 and/or the drain contacts 305. Conductive metal may be formed on the exposed portions of the source contacts 315 and/or the drain contacts 305 to form the metal contacts 365. The formation of the metal contacts 365 may result in the patterning of the second protective layer 420 of FIG. 4E to form the second insulating layer 355.

Figure 4G:
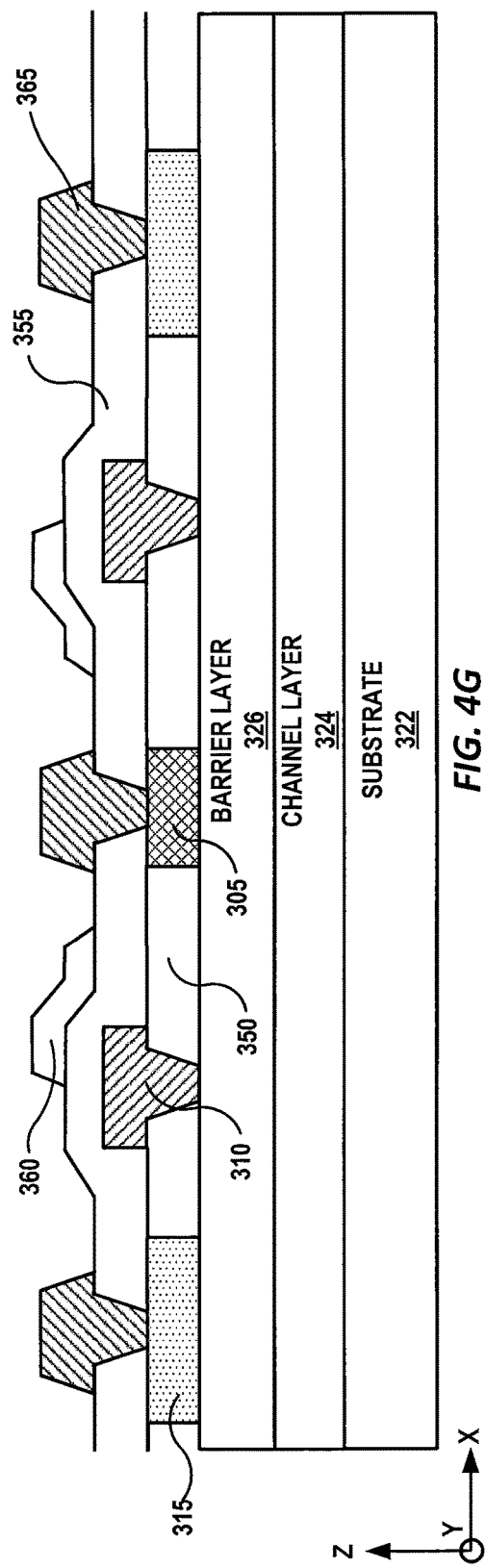

Referring to FIG. 4G, the substrate 122 (see FIG. 4F) may be thinned to form the thinned substrate 322. In some embodiments, the thickness of the substrate 322 is reduced using a grinder, such as an in-feed or creep feed grinder. In other embodiments, the thickness of the substrate 322 is reduced using lapping, chemical or reactive ion etching or combinations of these approaches with or without grinding. In still other embodiments, etching may be used to treat the backside of the substrate 322 to reduce damage to the substrate 322 that may result from the thinning operation. Methods of thinning a wafer are described, for example, in commonly assigned U.S. Pat. Nos. 7,291,529; 7,932,111; 7,259,402; and 8,513,686, the disclosures of which are incorporated herein by reference in their entirety.

In some embodiments according to the invention, the substrate 322 is thinned to a thickness of between about 40 µm to about 100 µm. In other embodiments, the substrate 322 is thinned to a thickness of between about 40 µm to about 75 µm. In further embodiments, the substrate 322 is thinned to a thickness of between about 40 µm to about 75 µm.

Figure 4H:
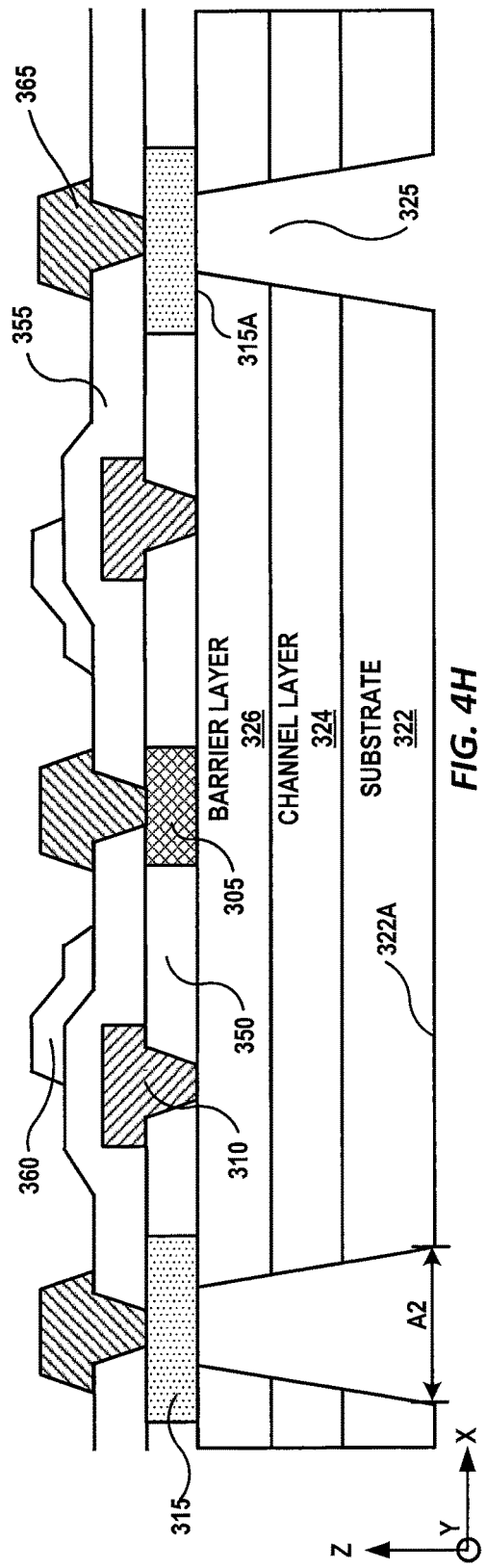

Referring to FIG. 4H, via 325 may be formed in the substrate 322, the channel layer 324 and the barrier layer 326. The via 325 may be formed by wet or dry etching. In some embodiments, the via 325 may be anisotropically etched such that sidewalls of the via 325 are inclined with respect to a top surface of the substrate 322. The via 325 may expose a bottom surface of the ohmic portion 315A of the source contact 315. In some embodiments, the source contact 315 may serve as an etch stop material during the formation of the via 325.

Due to the anisotropic etching, a largest cross-sectional area A2 of the via 325 may be at that portion of the via 325 that is adjacent the lower surface 322A of the substrate 322 (e.g., the opening of the via 325). In some embodiments, the anisotropic etching may result in the largest cross-sectional area A2 of the via being related to a thickness of the substrate 322, as thicker substrates 322 may result in wider openings of the via 325. Thus, thinning the substrate 322, as described with respect to FIG. 4G, may result in additional benefits due to the reduction of the cross-sectional area A2 of the via 325.

Figure 4I:
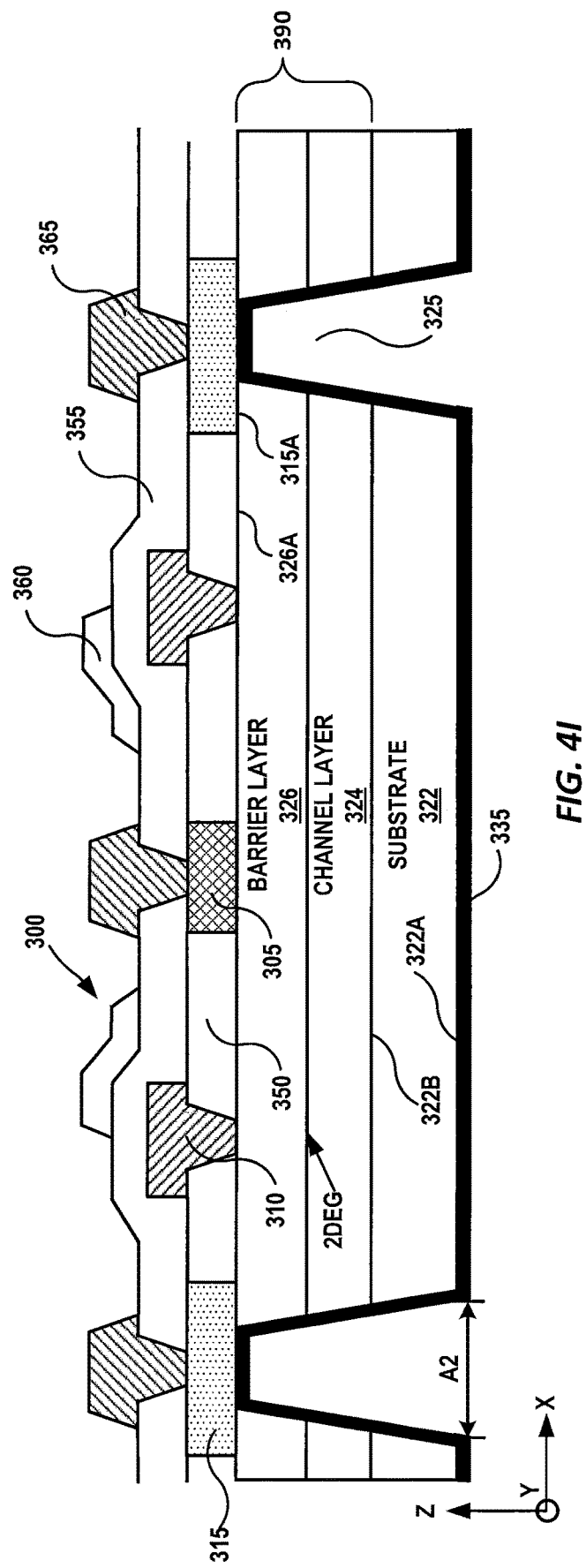

Referring to FIG. 4I, after formation of the via, backmetal layer 335 may be deposited on the lower surface 322A of the substrate 322, sidewalls of the via 325, and the bottom surface of the ohmic portion 315A of the source contact 315. Thus, the backmetal layer 335 may directly contact ohmic portions of the source contact 315. The backmetal layer 335 may include a conductive metal such as, for example, titanium, platinum, and/or gold.

Figure 5:
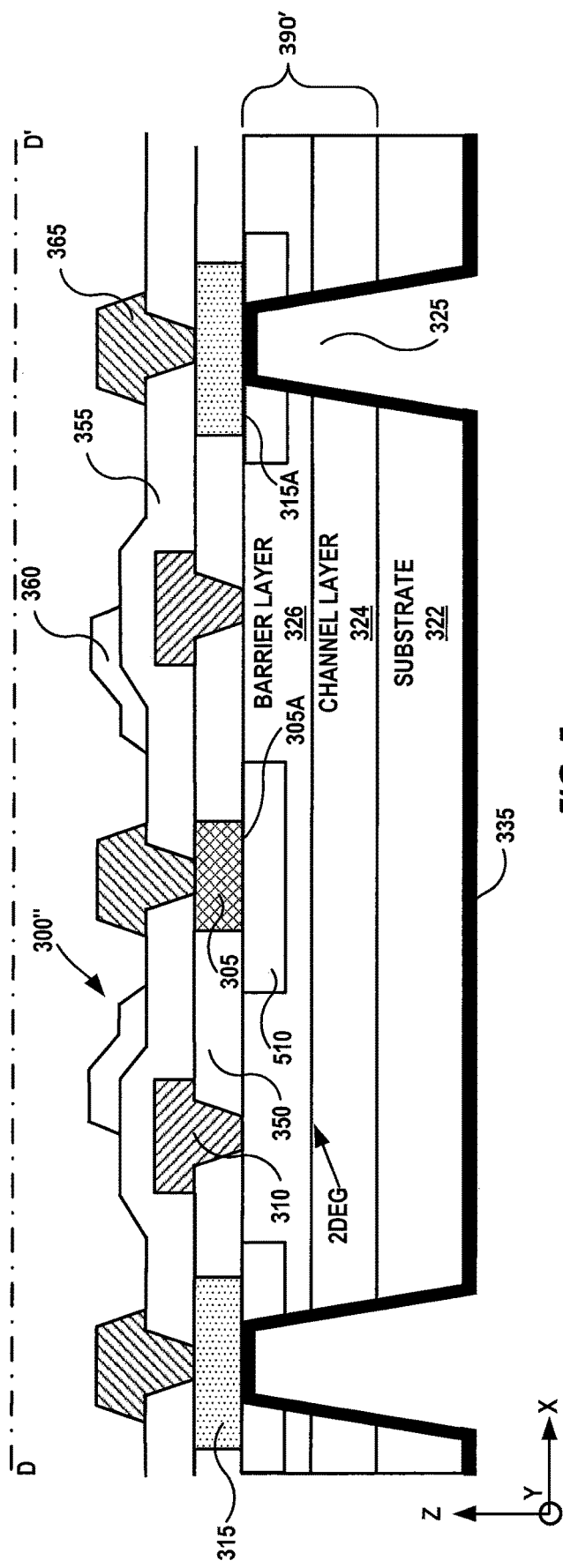
FIG. 5 is a schematic cross-sectional view of an additional embodiment of a HEMT device taken along line D-D' of FIG. 2A, according to embodiments of the present invention.

FIG. 5 is a schematic cross-sectional view of an additional embodiment of a HEMT device 300'' taken along line D-D' of FIG. 2A, according to embodiments of the present invention. Portions of FIG. 5 are substantially the same or similar as those illustrated in FIGS. 2B and 2C, and a repeat description thereof will be omitted for brevity. The HEMT device 300'' may share a substantially similar plan view as that of the HEMT device 300 of FIG. 2A and, as such, a duplicate illustration thereof is omitted.

Referring to FIG. 5, the HEMT device 300'' may have well regions 510 in the barrier layer 326 beneath one or more of the source contacts 315 and/or drain contacts 305. A bottom surface 315A of the ohmic portion of the source contact 315 and/or bottom surface 305A of the ohmic portion of the drain contact 305 may be in contact with respective ones of the well regions 510. The well regions 510 may be formed by performing a doping implant on the barrier layer 326. In some embodiments, the well regions 510 may be doped to have a higher doping concentration than the barrier layer 326. For example, when the barrier layer 326 is an n-type layer, the well region 510 may be doped to have a higher concentration of n-type dopants (e.g., an $N^+$ or $N^{++}$) than the barrier layer 326. In some embodiments, the implanting of the dopants to form the well regions 510 may be performed after the formation of the barrier layer 326 but before the formation of the source contacts 315 and/or the drain contacts 305.

In some embodiments, the via 325 may be formed to pass through the well region 510 under the source contact 315. Thus, a portion of the backmetal layer 335 on sidewalls of the via 325 may directly contact portions of one of the well regions 510. Though the well region 510 is illustrated in FIG. 5 as being on both sides of the via 325, the present invention is not limited thereto. In some embodiments, the well region 510 may only be on one side of the via 325. In some embodiments, the via 325 may be separated from the bottom surface 315A of the ohmic portion of the source contact 315 with portions of the well region 510 disposed between the via 325 and the bottom surface 315A of the ohmic portion of the source contact 315.

In addition, though FIG. 5 illustrates the via 325 as directly contacting the well region 510, the present invention is not limited thereto. In some embodiments a separation may be provided between the well region 510 and the via 325 and/or the backmetal layer 335.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in $N^+$, $N^-$, $P+$, $P^-$, $N^{++}$, $N^{--}$, $P^{++}$, $P^{--}$, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A high electron mobility transistor (HEMT), comprising:
   a substrate;
   a semiconductor structure on the substrate;
   a first via and a second via, each extending in the substrate and the semiconductor structure;
   a first ohmic source contact on the first via and a second ohmic source contact on the second via;
   a drain contact on the semiconductor structure and between, in plan view, the first via and the second via; and
   a gate contact between the first ohmic source contact and the drain contact, wherein a width of the first via decreases as the first via extends from a bottom surface of the substrate to a top surface of the substrate.

2. The HEMT of claim 1, further comprising a backmetal layer within the first via,
   wherein the backmetal layer directly contacts a bottom surface of the first ohmic source contact, and
   wherein a contact area between the backmetal layer and the bottom surface of the first ohmic source contact is fifty percent or more of an area of the bottom surface of the first ohmic source contact.

3. The HEMT of claim 1, wherein an area of a largest cross-section of the first via in a direction parallel to a top surface of the substrate is less than 1000 µm².

4. The HEMT of claim 1, wherein the first ohmic source contact is in a recess in an upper surface of the semiconductor structure.

5. The HEMT of claim 1, wherein a thickness of the substrate is 75 µm or less.

6. The HEMT of claim 1, wherein the semiconductor structure comprises a channel layer and a barrier layer on the channel layer.

7. The HEMT of claim 6, wherein the first via extends through the channel layer and the barrier layer.

8. A high electron mobility transistor (HEMT), comprising:
   a substrate comprising a first surface and a second surface on opposing sides of the substrate;
   a channel layer on the first surface of the substrate;
   a barrier layer on the channel layer;
   a source contact comprising a first ohmic contact on an upper surface of the barrier layer;
   a plurality of drain contacts and a plurality of gate contacts on the barrier layer; and
   a via extending from the second surface of the substrate to the first ohmic contact, wherein the via is between, in plan view, one of the drain contacts and one of the gate contacts.

9. The HEMT of claim 8, further comprising a backmetal layer within the via,
   wherein the backmetal layer directly contacts a bottom surface of the first ohmic contact, and
   wherein a contact area between the backmetal layer and the bottom surface of the first ohmic contact is fifty percent or more of an area of the bottom surface.

10. The HEMT of claim 8, wherein an area of a largest cross-section of the via in a direction parallel to the first surface of the substrate is less than 1000 µm².

11. The HEMT of claim 8, wherein the one of the drain contacts and the one of the gate contacts each extend in a first direction, and
   wherein the via is below a portion of the source contact that is between the one of the drain contacts and the one of the gate contacts in a second direction that is perpendicular to the first direction.

12. The HEMT of claim 8, wherein the first ohmic contact is in a recess in the upper surface of the barrier layer.

13. The HEMT of claim 8, wherein the via extends through the channel layer and the barrier layer.

14. The HEMT of claim 8, wherein a thickness of the substrate is 75 μm or less.

15. A high electron mobility transistor (HEMT), comprising:
a substrate;
a semiconductor structure on the substrate;
a first ohmic source contact and a second ohmic source contact on the semiconductor structure;
a drain contact on the semiconductor structure between the first ohmic source contact and the second ohmic source contact; and
a via extending between a bottom surface of the substrate and the first ohmic source contact,
wherein a distance between the first ohmic source contact and the second ohmic source contact is 60 μm or less, and
wherein the via is located below a first portion of the first ohmic source contact, and
wherein a second portion of the drain contact is between the first portion of the first ohmic source contact and the second ohmic source contact.

16. The HEMT of claim 15, wherein the semiconductor structure comprises a channel layer and a barrier layer on the channel layer, and
wherein the HEMT further comprises a doped well in the barrier layer adjacent the first ohmic source contact.

17. The HEMT of claim 15, wherein an area of a largest cross-section of the via in a direction parallel to the bottom surface of the substrate is less than 1000 μm$^2$.

18. The HEMT of claim 15, further comprising a backmetal layer within the via that contacts the first ohmic source contact.

19. The HEMT of claim 18,
wherein a contact area between the backmetal layer and a bottom surface of the first ohmic source contact is fifty percent or more of an area of the bottom surface.

* * * * *

UNITED STATES PATENT AND TRADEMARK OFFICE
CERTIFICATE OF CORRECTION

PATENT NO. : 10,923,585 B2
APPLICATION NO. : 16/440427
DATED : February 16, 2021
INVENTOR(S) : Bothe et al.

It is certified that error appears in the above-identified patent and that said Letters Patent is hereby corrected as shown below:

In the Specification

Column 8, Line 67: Please correct "MN" to read -- AlN --

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*